United States Patent [19]

Sirasud

[11] Patent Number: 4,825,150

[45] Date of Patent: Apr. 25, 1989

[54] VOLTAGE AND CONTINUITY TESTER

[75] Inventor: Anantsak Sirasud, Edwardsville, Ill.

[73] Assignee: FL Industries, Inc., Livingston, N.J.

[21] Appl. No.: 138,500

[22] Filed: Dec. 24, 1987

[51] Int. Cl.$^4$ .................... G01R 31/02; G01R 19/00
[52] U.S. Cl. .................................. 324/133; 324/556
[58] Field of Search .............................. 340/650–663; 324/555, 556, 133

[56] References Cited

U.S. PATENT DOCUMENTS

| | | |
|---|---|---|
| 4,214,200 | 7/1980 | Hollander . |
| 4,366,434 | 12/1982 | Ellis . |
| 4,388,589 | 6/1983 | Molldrem, Jr. . |
| 4,503,390 | 3/1985 | Wells, Jr. . |
| 4,550,287 | 10/1985 | Babcock . |
| 4,574,276 | 3/1986 | Sato . |
| 4,628,303 | 12/1986 | Boyle . |

FOREIGN PATENT DOCUMENTS

| | | | |
|---|---|---|---|
| 0133472 | 1/1979 | Fed. Rep. of Germany | 324/133 |
| 3130786 | 12/1983 | Fed. Rep. of Germany | 324/133 |
| 0318368 | 9/1929 | United Kingdom | 324/133 |

OTHER PUBLICATIONS

Logan: "Test Probe . . . "—Electronic Design—Feb. 1st, 1977—p. 72.

*Primary Examiner*—Reinhard J. Eisenzopf
*Assistant Examiner*—Jose M. Solis
*Attorney, Agent, or Firm*—Laff, Whitesel, Conte & Saret

[57] ABSTRACT

A battery powered tester has an electrical testing circuit combining continuity, polarity, and voltage amplitude circuits. The testing circuit for measuring a test voltage or relative continuity has first and second inputs to which first and second test points can be respectively coupled by RED and BLACK prods. The continuity, polarity, and voltage amplitude circuits are coupled in parallel to the first and second inputs, the polarity circuit being symmetrically coupled to the inputs. The polarity circuit has first and second polarity lamps and a sensing circuit for lighting the first polarity lamp when the test voltage is positive and lighting the second polarity lamp when the test voltage is negative. The continuity circuit has a continuity lamp separate from the polarity lamps and a driving circuit for lighting the continuity lamp whenever a zero or low passive impedance is coupled to the first and second inputs. A transistorized switching circuit monitors the difference in voltage between the first and second inputs, and if the difference equals or exceeds a predetermined continuity limit voltage, the switching circuit disables the signal to the driving circuit. The voltage amplitude circuit uses a solenoid-type voltmeter coupled between the first and second inputs by a bilateral silicon switch to measure the absolute amplitude of the test voltage.

12 Claims, 5 Drawing Sheets

VOLTAGE AND CONTINUITY TESTER

The invention relates to devices for electrical testing, and more particularly to a rugged AC/DC voltage and continuity testing device. Further, it relates to providing a simple and inexpensive solenoid-type AC/DC voltage tester having a two terminal testing circuit combining improved polarity, continuity, and voltage amplitude indicating circuits.

Voltage testers built with solenoid-type voltmeters are rugged and reliable and are typically used at construction and maintenance sites for testing and measuring both AC and DC voltages up to about 600 volts. As the solenoid voltmeter does not indicate voltage polarity, a separate polarity indicating circuit is generally included in such testers. Often the tester also includes a continuity circuit for indicating when there is electrical continuity between the prods of the tester.

An example of a conventional voltage and continuity testing device of this type is described in U.S. Pat. No. 4,503,390 of Wells. The Wells' tester has a solenoid-actuated voltmeter for AC/DC for measuring voltages above about 120 volts and a polarity circuit for indicating the polarity of voltages above about 4–5 volts. The polarity circuit uses separate positive (+) and negative (−) lamps for indicating voltage polarity. Although the Wells' tester also has a continuity testing circuit, it has the disadvantage that the lamp used to indicate positive polarity must double as the continuity indicator lamp. This multiple indicating function can be confusing to the user and requires certain design compromises in the polarity and continuity circuits in order for them to share the same indicator lamp.

For example, Wells' polarity measuring circuit is so unbalanced that it will give an indication of positive polarity for the neutral value of zero volts or even for small voltages of negative polarity. Another disadvantage is that in normal use the battery Wells provides to power the dual purpose indicator lamp for positive polarity and continuity will be exhausted faster than the companion battery of identical capacity provided to power the negative polarity indicator lamp.

Therefore, it is an object of the present invention to provide a new and improved circuit for both measuring voltage and testing electrical continuity that is balanced and does not favor one polarity over the other. A further object is to provide such a circuit having a separate indicator lamp for use in testing continuity testing that is automatically inactivated once the voltage input to the tester reaches a preset threshold for voltage polarity testing. Yet another object is to provide a more efficient circuit that can detect voltage polarity at levels lower than can be easily achieved with the Wells circuit, that is, at a level below three volts.

SUMMARY OF THE INVENTION

The electrical tester of the invention has a combined testing circuit that performs the three functions of continuity testing, DC polarity testing, and AC/DC voltage amplitude measurement. When a passive low impedance is coupled between inputs for RED and BLACK prods, a continuity circuit is caused to turn on a normally off YELLOW lamp, which can be a light-emitting diode (LED). If the RED prod and BLACK prod are instead connected to test points that produce a detected voltage in excess of about 2.5 volts, the voltage polarity is suitably indicated by turning on a normally off RED (+) or GREEN (−) lamp. The continuity circuit is non-responsive to an input voltage that is negative and is automatically disabled when a positive input voltage exceeds 2.5 volts. When the magnitude of the detected input voltage exceeds about 8 volts, a solenoid voltmeter is automatically switched into the circuit by a bilateral switch, but the voltmeter only gives a readable indication for voltages above about 100 volts.

DETAILED DESCRIPTION

Figure 3:
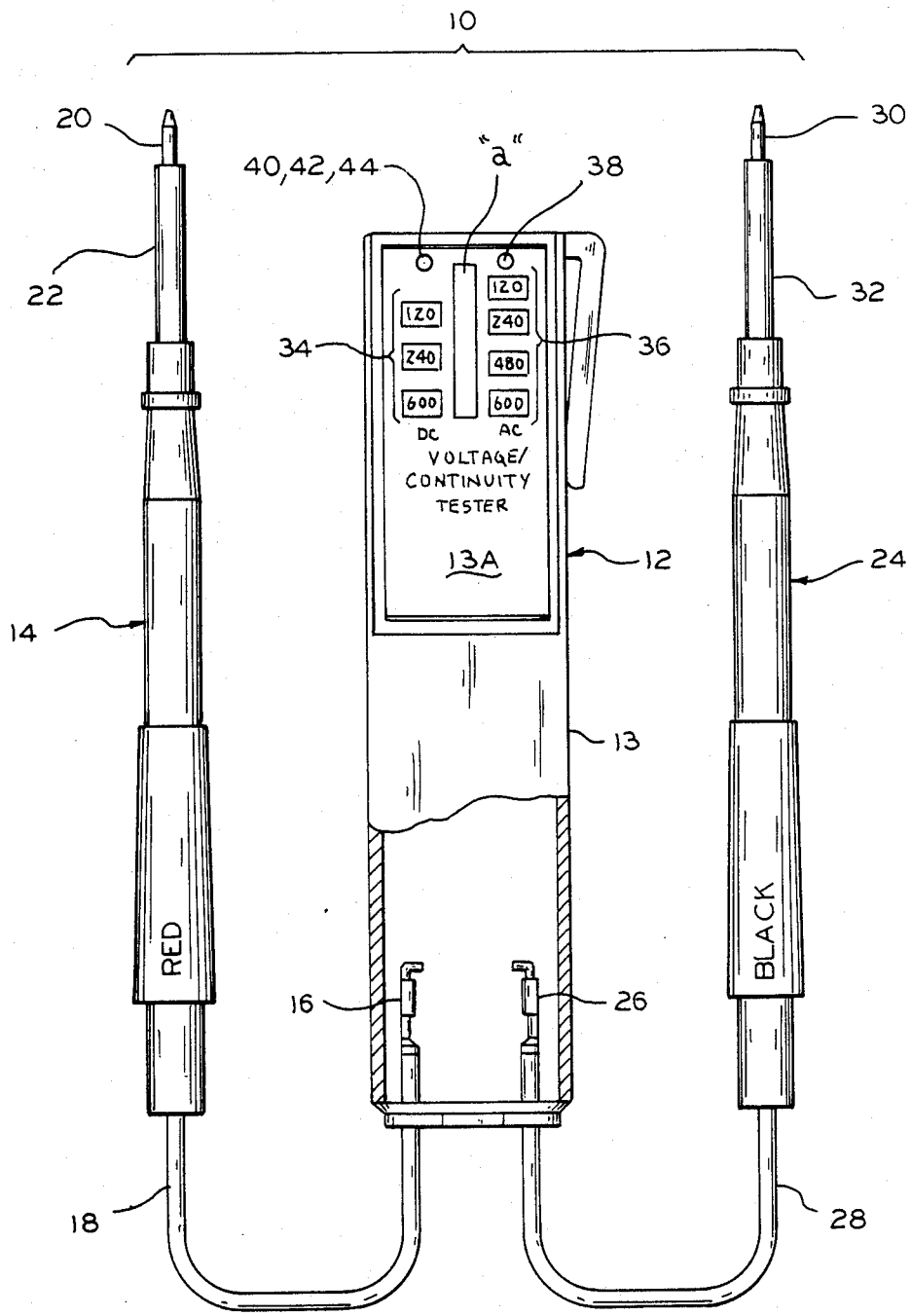
FIG. 3 is a perspective view of a testing device using the circuit of the invention.

FIG. 3 shows a testing device 10 for using the circuit of the invention. A main unit 12 has a housing 13 into which a red 14 and a black 24 prod are plugged. Each prod 14, 24 has a conductive electrical prod tip 20, 30 which the user can hold against a conductive element or area whose voltage or continuity is to be tested. The conductive tip of each prod 14, 24 is electrically connected to a respective prod lead 18, 28, which couples it to a respective insertion plug 16, 26. The plugs 16, 26 are plugged into electronic testing circuitry enclosed in main unit 12. As protection for the user, each prod 14, 24 includes a cylindrical prod sleeve 22, 32 of insulating material, through which passes the electrical connection between the prod's tip and its respective prod lead.

Figure 3A:
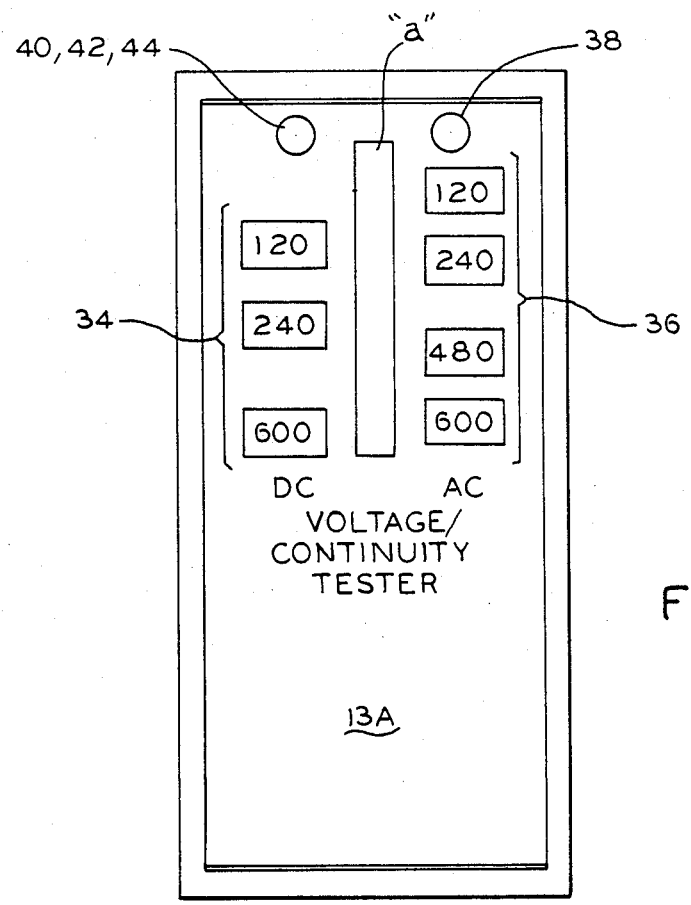
FIG. 3A is an enlarged view of the face of the testing device of FIG. 3.

As shown in FIGS. 3 and 3A, the face 13A of testing device 10 has three types of indictors: a voltage amplitude indicator, a continuity indicator, and a voltage polarity indictor. For voltage amplitude there is a small transparent indicator window "a". At the left 34 and right 36 are inscribed calibrated voltage readings. These readings are respectively used as a scale to indicate, in a manner to be described, the measured amplitude of the DC or AC voltage detected between prod tips 20, 30.

For continuity testing, a yellow lamp 38 is lit to indicate continuity when the electrical impedance between prod tips 20, 30 is relatively low (0–350 kilohms). A polarity indicator 40 shows the polarity of the voltage between the prod tips by means of a RED lamp 42 for positive and a GREEN lamp 44 for negative. Lamps 42 and 44 can be molded into a single unit, a dual color LED.

Figure 4A:
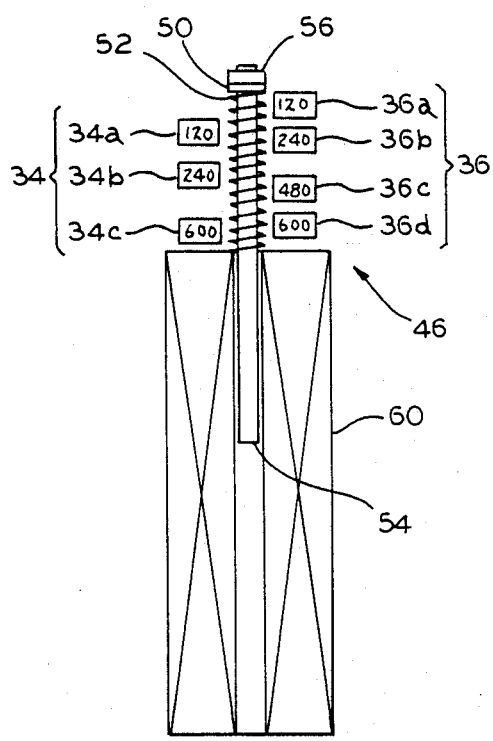
FIG. 4A is a partial cross-section of a solenoid-type voltage amplitude indicator employed in the testing device of FIG. 3, shown when the input AC or DC voltage amplitude is zero.
Figure 4B:
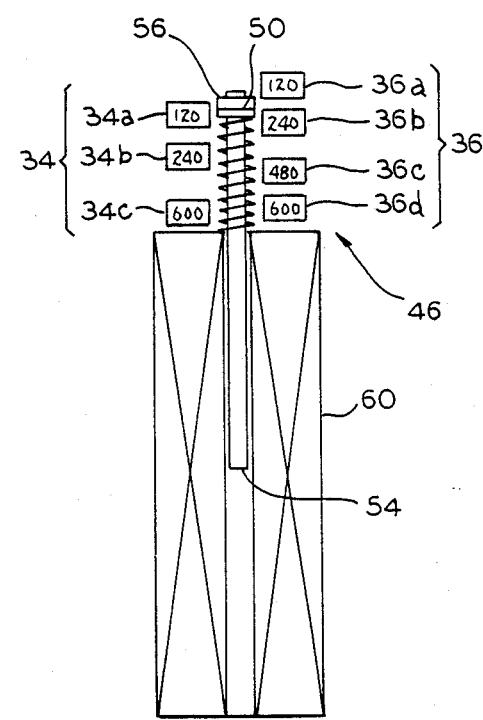
FIG. 4B is a partial cross-section showing the voltage amplitude indictor of FIG. 4A, shown when the input AC or DC voltage amplitude is nonzero.

As shown in the partial cross section of FIG. 4A, a solenoid-actuated indictor mechanism 46 is mounted within the housing just below transparent indicator window "a". Indicator mechanism 46 has a solenoid coil 60 which is coupled to receive the voltage developed between prod tips 20, 30. Indicator mechanism 46 also includes a movable I-shaped plunger 50 that is adapted to be drawn into coil 60 when the coil is energized by the voltage measured between prod tips 20, 30. A helical spring 52 provides an outward spring bias that must be overcome by the magnetic force of the energized solenoid coil 60 to draw in I-shaped plunger 50. FIG. 4A shows the normal position of plunger 50 when coil 60 is deenergized, which corresponds to a detected voltage of zero. When the DC or AC voltage detected between prod tips 20, 30 exceeds a predetermined minimum, typically arranged to be about 80-90 volts, coil 60 is sufficiently energized to overcome the bias of spring 52 and draw in plunger 50 as shown in FIG. 4B.

I-shaped plunger 50 is made of a rod 54 of high magnetic permeability, such as iron or steel, at one end of which is affixed a brightly colored transverse indictor bar 56. When rod 54 is drawn in by coil 60, indicator bar 56 moves closer to calibrated voltage readings 34 and 36, whose calibrated inscription corresponds to the amplitude of the detected voltage. Thus, indictor mechanism 46 cooperates with the reading to form a solenoid-type AC/DC voltmeter, readings 34 and 36 being respectively the DC and AC scales.

Figure 5:
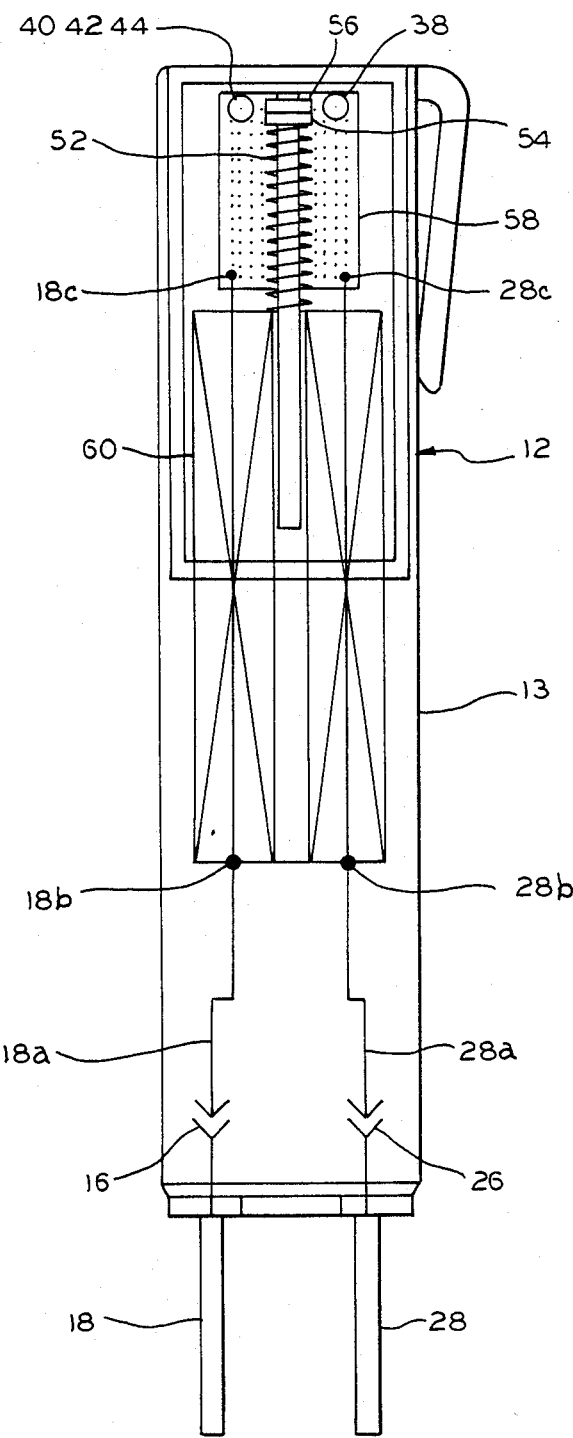
FIG. 5 is a cross section of the testing device of FIG. 3 at a level just beneath a front face voltage scale.

A cross section showing the construction of the testing device of FIG. 3 at a level just beneath the front face 13A is shown in FIG. 5. A circuit board 58 is mounted within housing 13 beneath the indictor mechanism (50, 52, 54, 56, 60) of FIGS. 4A and 4B. For simplicity, the components on circuit board 58 are omitted in FIG. 5, except for continuity indicator lamp 38 and polarity indicator lamps 42 and 44. Also shown are leads 18a and 28a which respectively connect the detected voltages in the electrodes of plugs 16, 26 from prod leads 18, 28 to input terminals 18c and 28c of circuit board 58.

Figure 1:
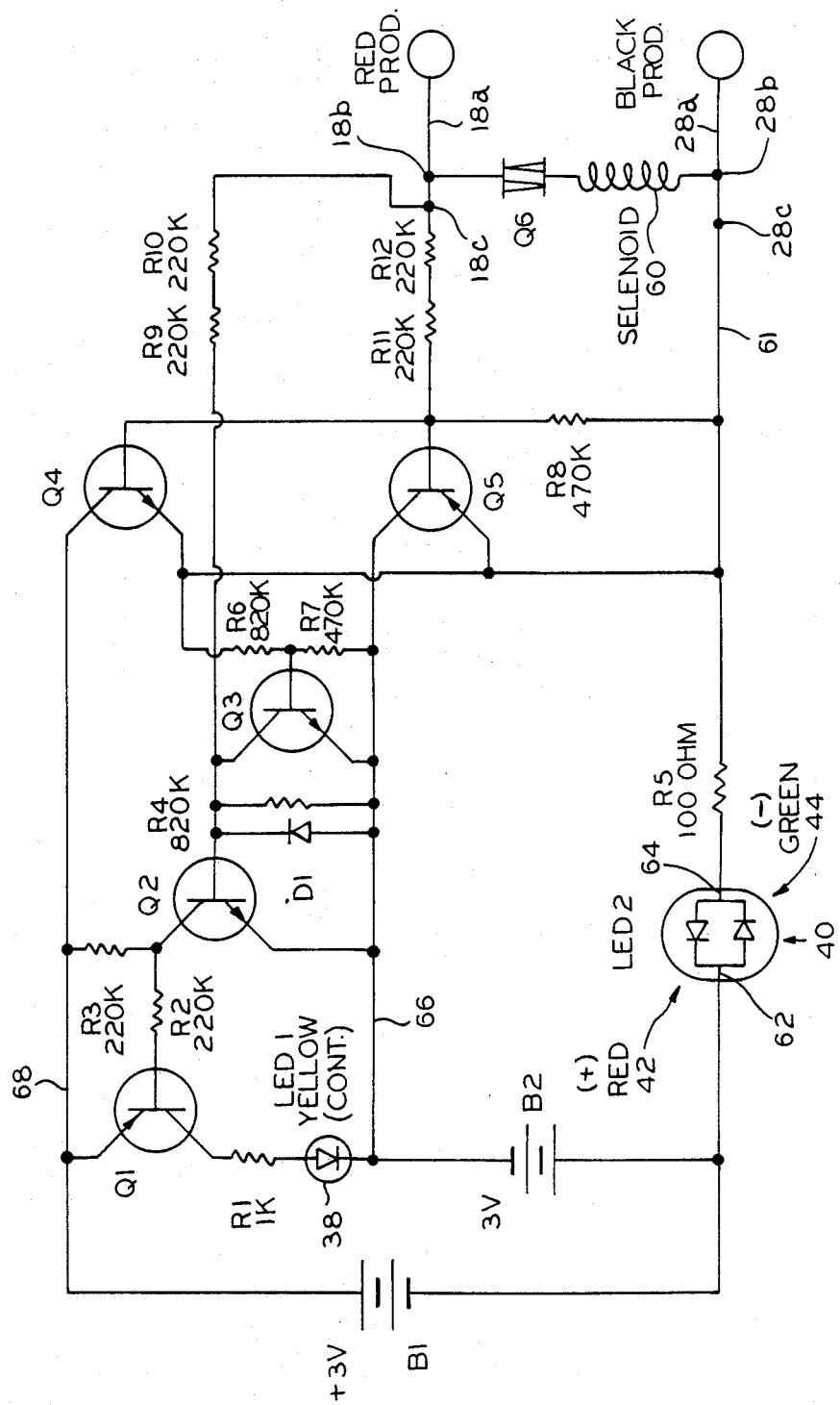
FIG. 1 is a schematic of an embodiment of the voltage and continuity testing circuit of the invention.
Figure 1A:
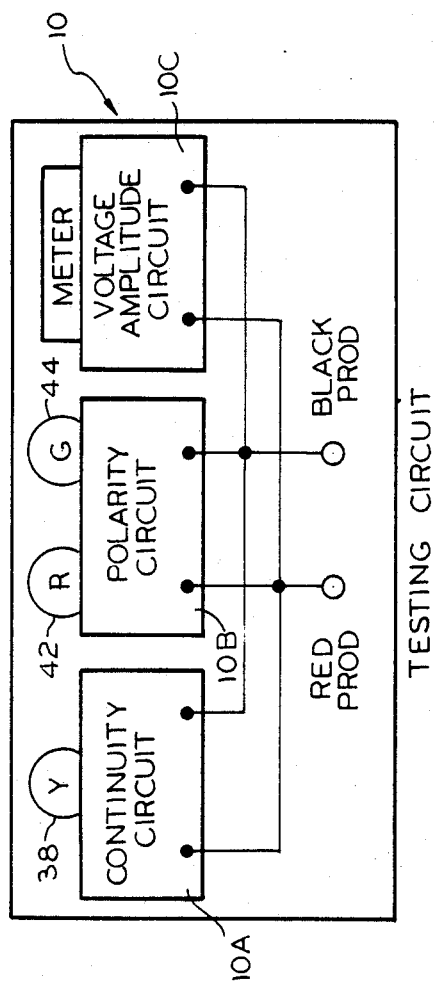
FIG. 1A is a simplified schematic of the voltage and continuity testing circuit of the invention.

As shown in the simplified schematic of FIG. 1A, the voltage and continuity testing circuit 10 has two floating input terminals for the RED and BLACK prods. Testing circuit 10 is made up of a continuity circuit 10A, a polarity circuit 10B, and a voltage amplitude circuit 20C, each of which is connected in parallel to the two input terminals. Continuity circuit 10A indicates continuity by means of the YELLOW continuity lamp 38, which is separate from the RED and GREEN lamps 42, 44 used by the polarity circuit 10B. The continuity circuit includes means for automatically disabling itself when the difference in voltage between the RED and BLACK prods equals or exceeds a predetermined voltage. The METER of voltage amplitude circuit 10C is the one implemented by the indicator mechanism 46 and readings 34 and 36 of FIGS. 4A and 4B.

Figure 2:
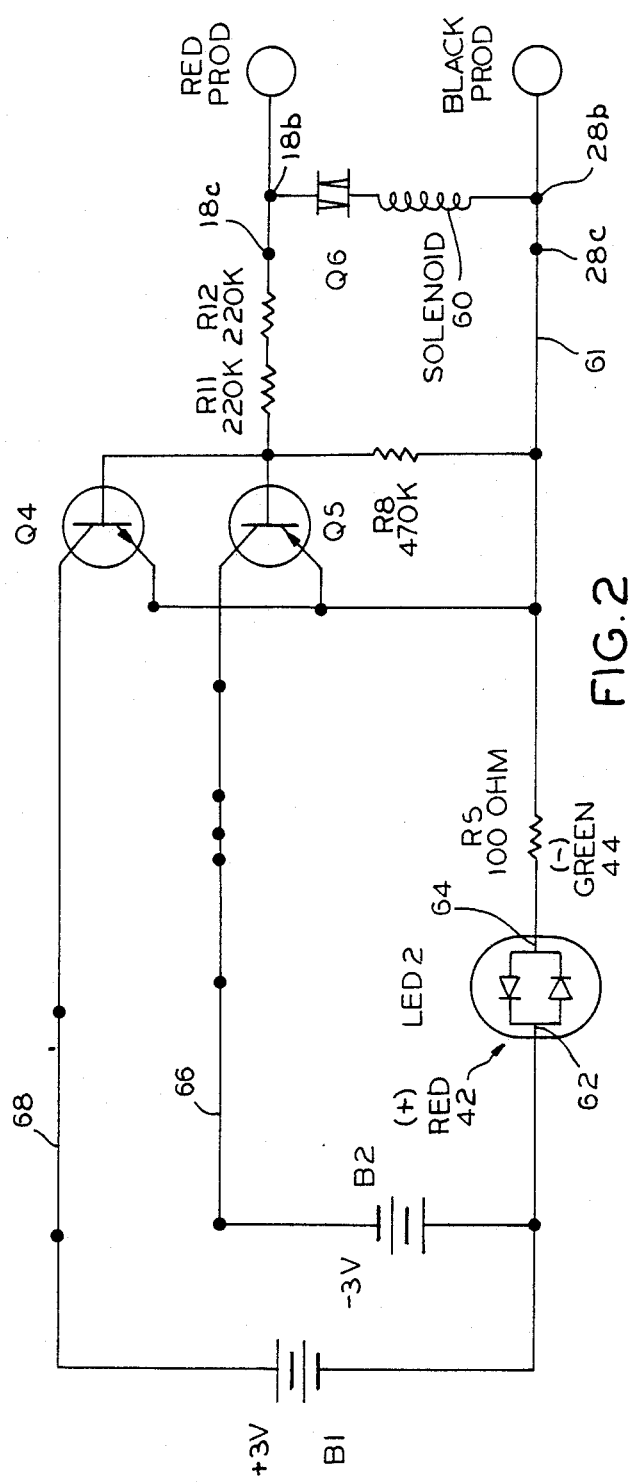
FIG. 2 is a simplified schematic of the embodiment of FIG. 1 showing just the components and connections needed for indicating voltage polarity and amplitude.

A simplified but more detailed schematic of the embodiment of the circuit of circuit board 58 with just the components and connections needed for indicating voltage polarity and amplitude is shown in FIG. 2. The detected voltage from the red and black prods is input to the circuit at terminals 18b, 18c and 28b, 28c across which in series are the leads of solenoid coil 60 and a bilateral silicon switch Q6.

When the amplitude of the voltage across bilateral switch Q6 is below a predetermined switch voltage, typically about 8 volts, bilateral switch exhibits a high impedance in either direction, being effectively an open circuit. But when the voltage drop tending to induce current flow in a particular direction exceeds the switch voltage, the bilateral switch is triggered to conduct in that direction, suddenly exhibiting a low impedance, effectively closing the switch in the direction concerned. Thus, bilateral switch Q6 isolates the low impedance solenoid coil from the rest of the circuit until the detected voltage exceeds the switch voltage of about 8 volts.

A detected voltage above the switch voltage will close the bilateral switch and be input across solenoid coil 60. But as previously mentioned, the magnetic force of the energized solenoid will not begin to overcome the spring bias of indicator mechanism 46 until the detected voltage exceeds a predetermined voltmeter minimum, typically about 80-90 volts. Detected voltages above the voltmeter minimum will be measured by the voltmeter formed by solenoid indicator mechanism 46 and window readings 34 and 36.

Since the solenoid voltmeter does not indicate voltage polarity, a polarity circuit is provided formed by NPN switching transistor Q4, PNP switching transistor Q5, base resistor R8, input resistors R11 and R12, batteries B1 and B2, load limiting resistor R5, and a light-emitting diode unit LED2. Unit LED2 has RED 42 and GREEN 44 light-emitting diodes in parallel with each other, but oriented in opposite directions. It is particularly convenient if diodes 42 and 44 are molded into one piece. The emitters of transistors Q4 and Q5 and one terminal of load limiting resistor R5 (about 100 ohms) are connected to input terminal 28c. The other terminal of resistor R5 is connected to a terminal 64 of LED2. The anode of a battery B1 (3 volts) is connected to the collector of transistor Q4, and the cathode of battery B1 is connected to the other terminal 62 of LED2. The cathode of a companion battery B2 (3 volts) is connected to the collector of transistor Q5, and the anode of battery B2 is connected to terminal 62 of LED2.

Base resistor R8 (470 kohm) connects the bases of both transistors Q4 and Q5 to input terminal 28c, biasing transistors Q4 and Q5 OFF. Input resistors R11, R12 (220 kohm each) are connected in series between the bases of Q4 and Q5 and the other input terminal 18c, so that they form an input voltage divider with base resistor R8. The voltage divider R11, R12, R8 puts about 52% (470 kohm/910 kohm) of the input detector voltage at terminals 18c, 28c across the base-to-emitter junctions of transistors Q4 and Q5. Therefore, when the detected voltage reaches about 2.5 volts in amplitude, the input voltage divider puts about 1.25 volts across the base-to-emitter junctions. If the RED PROD is positive relative to the black prod, the 1.25 volts turns ON transistor Q4 and keeps transistor Q5 biased OFF. When transistor Q4 is turned ON, it completes the circuit B1, Q4, R5, RED LED 42, lighting the RED LED to indicate positive voltage polarity.

If instead the RED PROD is about 2.5 volts or more negative relative to the black prod, transistor Q4 is biased OFF and transistor Q5 is turned ON. This completes the circuit B2, Q5, R5, GREEN LED 44, lighting the GREEN LED to indicate negative voltage polarity.

If the detected voltage is an AC voltage, the RED LED 42 will light in each positive half cycle of the AC voltage and the GREEN LED 44 will light in each negative half cycle of the AC voltage. For example, a detected alternating voltage of 60 cycles/second will alternately cause both the RED and GREEN LED's to light, making the output of LED2 a unique red-green color.

It is a feature of this polarity indicating circuit that it responds symmetrically with equal sensitivity to the input detected voltage, not favoring either polarity. If on the average the detected voltages are equally likely to be positive or negative, the stored energy in batteries B1 and B2 will be expended for lighting LED diodes 42, 44 in about equal amounts over time. This balanced use permits batteries B1 and B2 to be periodically replaced as a set while assuring full use of each. Another feature is that this polarity indicating circuit is very sensitive, working when the amplitude of the input detected voltage is as low as about 2.5 volts.

A schematic of a full embodiment of the voltage and continuity testing circuit, including a continuity indicator, is shown in FIG. 1. The full circuit includes all the components of the simplified circuit of FIG. 2 as well as additional continuity sensing elements transistors Q1, Q2, and Q3, protective diode D1, YELLOW light-emitting diode LED1, and resistors R1, R2, R3, R4, R6, R7, R9, and R10.

The continuity circuit lights YELLOW LED1 whenever the RED and BLACK conducting prod tips 20, 30 are contacted against each other, or are contacted against different test points that are coupled by a relatively low resistance (0–350 kohm). Touching the prod tips 20, 30 together to light LED1 can be used as a safety test to verify that there is no electrical break in the prod leads 18, 28, or their plugs 16, 26. Touching the prod tips to opposite ends of a wire, coil, or other low impedance passive element can be used to verify the passive element's low impedance and electrical integrity.

During continuity testing terminals 18b, 18c and 28b, 28c will either be shorted together or coupled by a passive element. The difference between the voltage at terminals 18b, 18c and the voltage at terminals 28b, 28c will then either be zero or a small positive voltage too low (less than 2.5 volts) to close bilateral switch Q6 or turn on polarity sensing transistors Q4, Q5.

Transistor Q2, the key element for continuity testing, is an NPN transistor having its emitter connected at line 66 to the cathode of battery B2 and its collector connected by a load resistor R3 (about 220 kohm) to the anode of battery B1 at line 68. Normally transistor Q2 is biased off by base resistor R4 (820 kohm), which couples the base of Q2 to its emitter at line 66. A diode D1 is in parallel across resistor R4 with its cathode end connected to the base of Q2 to protect transistor Q2 against the input of any negative transients.

A pair of series connected input resistors R9, R10 (about 220 kohm each) couple RED PROD input terminal 18b, 18c to the base of transistor Q2. Because of this R9, R10 input connection, battery B2 normally provides a weak positive voltage to the base of Q2 via forward biased GREEN diode 44 and a voltage divider formed of R5 (100 ohms), R8 (470 kohm), R11, R12 (220 kohm each), R9, R10 (220 kohm each) and R4 (820 kohm). The voltage divider puts only about 38% (820 kohm/2,170 kohm) of B2's 3 volt positive voltage minus the 1.5 voltage drop of GREEN LED across the base-to-emitter junction of transistor Q2. This 38% of 1.5 volts is about 0.57 volt, insufficient to turn ON transistor Q2. Because the current in the voltage divider is very weak, about 0.0007 ma (1.5 V/2,170 kohm), even though GREEN LED 44 conducts, it is unable to give off a noticeable amount of light. (Typically, a current of about 20 ma is applied to noticeably light GREEN LED 44.)

However, suppose a good conductor (zero ohms) is coupled between RED PROD terminal 18b, 18c and BLACK PROD terminal 28b, 28c. Because this shorts out resistors R8, R11, and R12, the voltage divider puts about 65% (820 kohm/1,260 kohm) of the 1.5 volts (battery B2 minus drop across the GREEN LED) across the base-to-emitter junction of transistor Q2. This is about 0.975 volts, which is sufficient to partially turn ON transistor Q2, causing current to flow in its collector. Thus, coupling a good conductor between the prods causes normally OFF transistor Q2 to partially turn ON.

When terminals 18b, 18c and 28b, 28c are coupled by a zero impedance and transistor Q2 is ON, we can estimate the maximum current flowing in GREEN LED 44 as being limited by the series resistance R9, R10 (about 220 kohms each) and the 3 volts of battery B2 minus the 1.5 volt drop across the conducting GREEN LED. This is only about 0.0035 ma (1.5 V/440 kohm), so even though GREEN LED 44 conducts, it is unable to give off a noticeable amount of light Element Q1 is a PNP transistor used to form a lamp driver (and current amplifier) circuit coupled to the collector of transistor Q2. The emitter of transistor Q1 is coupled by load limiting resistor R1 (about 1 kohm) in series with the YELLOW LED1 to the cathode of battery B2 at line 66. The collector of transistor Q1 is connected to the anode of battery B1 at line 68, and its base is coupled for input to the collector of transistor Q2 by input resistor R2 (about 220 kohm). Normally, transistor Q2 is OFF, enabling resistors R2 and R3 to bias transistor Q1 OFF.

When a continuity measurement causes transistor Q2 to partially turn ON, its collector voltage approaches that of its emitter, line 66. This causes the voltage input to the base of transistor Q1 by resistor R2 to be sufficient to turn ON transistor Q1. The combined series voltages of batteries B1 and B2 (about 6 volts) are then applied to YELLOW LED1 in series with load limiting resistor R1. This lights LED 1 to indicate that continuity has been detected.

Now suppose that instead of zero ohms, an impedance of about 350 kohm is coupled between RED PROD terminal 18b, 18c and BLACK PROD terminal 28b, 28c. This 350 kohms is effectively in parallel with the series connection of resistors R8 (470 kohm), R11 (220 kohm) and R12 (220 kohm), forming an equivalent lower resistance of about 253 kohm. Then the previously mentioned voltage divider puts about 54% (820 kohm/1,513 kohm) of the 1.5 volts (3 volts of battery B2 minus the 1.5 volts across the conducting GREEN LED) across the base-to-emitter junction of transistor Q2. This is about 0.81 volts, sufficient to partially turn ON transistor Q2, causing transistor Q1 to turn on YELLOW LED1 to indicate continuity. Thus, there will be a YELLOW continuity indication if the detected input impedance falls in about the range 0 to 350 kohms.

Element Q3 is a NPN transistor used to form a circuit for automatically disabling the continuity testing circuit whenever the input voltage between terminals 18b 18c and 28b, 28c becomes sufficiently positive to turn on transistor Q4 of the polarity circuit. The emitter of transistor Q3 is connected to the emitter of transistor Q2 at line 66 and the collector of Q3 is connected to the base of Q2. Normally, transistor Q3 is biased OFF by a resistor R7 (about 470 kohm) connected between its base and emitter and has negligible effect on the functioning of the continuity detecting circuit.

However, an input resistor R6 (about 820 kohm) couples the base of transistor Q3 to the emitter of transistor Q4. When the detected input voltage between terminals 18b, 18c and 28b, 28c becomes positive enough (about 2.5 volts) to turn on transistor Q4, the emitter-collector junction of Q4 closes. This applies the series connected voltages of batteries B1 and B2 (about 6 volts combined) to the input voltage divider formed by R6 (820) and R7 (470). About 36% (470 kohm/1,290 kohm) of the combined positive battery voltage B1+B2 (6 volts) is applied across the base-to-emitter junction of transistor Q3. This is about 2.2 volts, sufficient to turn transistor Q3 ON. The turning on of Q3 effectively drops the voltage on the base of Q2 to that of the collector of Q2, biasing Q2 OFF. As a result, lamp driver (and current amplifier) transistor Q1 is also biased OFF, disabling the YELLOW continuity indicator LED1.

Thus, the inventive circuit tests continuity and DC polarity and measures AC/DC voltage amplitude. Disposing a passive continuity between the RED PROD and BLACK PROD causes a normally off YELLOW lamp LED1 to turn on. A detected voltage in excess of about 2.5 volts amplitude between the RED and BLACK prods turns on the appropriate normally off RED (+) or GREEN (−) polarity lamp. The continuity circuit is automatically disabled when the detected input voltage exceed +2.5 volts, and a solenoid voltmeter is automatically switched into the circuit when the amplitude of the detected voltage exceeds about 8 volts.

The invention claimed is:

1. An electrical testing circuit for measuring a test voltage which is the difference between first and second voltages respectively associated with first and second test points or detecting the relative continuity between the first and second test points, comprising:
    (a) first and second inputs to which the first and second test points can be respectively electrically connected;
    (b) a continuity circuit, a polarity circuit, and a voltage amplitude circuit continuously and simultaneously connected electrically to the first and second signal inputs;
    (c) battery means electrically connected to the continuity and polarity circuits for powering them;
    (d) the polarity circuit comprising first and second polarity indicators, and sensing means having a portion for activating the first polarity indicator whenever the test voltage is positive and a second portion for activating the second polarity indicator whenever the test voltage is negative, the portion of the sensing means which activates the first polarity indicator being connected to the first and second inputs in substantially the same way as the portion of the sensing means which activates the second polarity indicator;
    (e) the continuity circuit comprising a continuity indicator separate from the polarity indicators, driving means for activating the continuity indicator whenever a zero or a low passive impedance is electrically connected between the first and second inputs, and disabling means for disabling the driving means if the test voltage between the first and second inputs equals or exceeds a predetermined continuity limit voltage; and
    (f) the voltage amplitude circuit comprising meter means for measuring the absolute amplitude of the test voltage.

2. The testing circuit of claim 1 wherein the first and second polarity indicators and the continuity indicator are lamps which light when activated.

3. The testing circuit of claim 2 wherein the sensing means is balanced by including an NPN transistor electrically connected to light the first polarity lamp and a PNP transistor to light the second polarity lamp.

4. The testing circuit of claim 3 wherein the bases of the NPN and PNP transistors are directly connected to each other and connected to the first input and the emitters of said transistors are directly connected to each other and the second input.

5. The testing circuit of claim 2 wherein the driving means for lighting the continuity lamp includes a first switching transistor that must be at least partially ON to light the continuity lamp, and the disabling means includes a second transistor, which, whenever the voltage between the first and second inputs equals or exceeds a predetermined continuity limit voltage, provides a sufficiently low impedance electrical path between the first transistor's base and emitter to bias the first transistor OFF.

6. The testing circuit of claim 1 wherein the polarity circuit includes threshold means for enabling the sensing means only when the absolute value of the test voltage equals or exceeds a predetermined polarity threshold voltage.

7. The testing circuit of claim 6 wherein the predetermined polarity threshold voltage is about 2.5 volts.

8. The testing circuit of claim 1 wherein the voltage amplitude circuit includes bilateral switching means for disabling the meter means until the absolute amplitude of the test voltage equals or exceeds a predetermined amplitude threshold voltage.

9. The testing circuit of claim 1 wherein the first and second polarity indicators are LED diodes of different colors connected in parallel to each other but oriented in opposite directions.

10. The testing circuit of claim 1 wherein the first and second polarity indictors are first and second LED diodes of different colors connected in parallel to each other but oriented in opposite directions and the sensing means is balanced by including an NPN transistor which lights the first LED diode and a PNP transistor which lights the second LED diode.

11. The testing circuit of claim 1 wherein the disabling means disables the driving means if the test voltage exceeds 2.5 volts.

12. An electrical tester for measuring a test voltage which is the difference between first and second voltages respectively associated with first and second test points or detecting the relative continuity between the first and second test points, comprising:
    (a) first and second inputs to which the first and second test points can be respectively electrically connected;
    (b) a testing circuit combining a continuity circuit, a polarity circuit, and a voltage amplitude circuit continuously and simultaneously connected electrically to the first and second signal inputs
    (c) battery means electrically connected to the continuity and polarity circuits for powering them;
    (d) a housing for the first and second inputs, the testing circuit, and battery means;
    (e) the polarity circuit comprising first and second polarity lamps, and sensing means having a portion for lighting the first polarity lamp whenever the test voltage is positive and a second portion for lighting the second polarity lamp whenever the test voltage is negative, the portion of the sensing means which lights the first polarity lamp being connected to the first and second inputs in substantially the same way as the portion of the sensing means which lights the second polarity lamp;

(f) the continuity circuit comprising a continuity lamp separate from the polarity lamps, driving means for activating the continuity lamp whenever a zero or a low passive impedance is electrically connected between the first and second inputs, and disabling means for disabling the driving means if the test voltage between the first and second inputs equals or exceeds a predetermined continuity limit voltage; and (g) the voltage amplitude circuit comprising a solenoid-type AC/DC meter means for measuring the absolute amplitude of the test voltage.

* * * * *